(12) United States Patent
Miller et al.

(10) Patent No.: US 7,483,271 B2
(45) Date of Patent: Jan. 27, 2009

(54) HIGH DENSITY CARD RETENTION DEVICE

(75) Inventors: Richard D. Miller, Manchester, NH (US); Adam D. Wachsman, Salem, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 68 days.

(21) Appl. No.: 11/632,592

(22) PCT Filed: Apr. 26, 2006

(86) PCT No.: PCT/US2006/015741

§ 371 (c)(1),
(2), (4) Date: Jan. 16, 2007

(87) PCT Pub. No.: WO2006/124212

PCT Pub. Date: Nov. 23, 2006

(65) Prior Publication Data

US 2007/0211442 A1    Sep. 13, 2007

Related U.S. Application Data

(60) Provisional application No. 60/682,756, filed on May 19, 2005.

(51) Int. Cl.
*H05K 7/20* (2006.01)
*F16B 2/14* (2006.01)

(52) U.S. Cl. .............. 361/704; 361/719; 361/721; 411/79; 211/43; 403/409.1; 165/80.2

(58) Field of Classification Search ............. 361/704, 361/719, 721; 165/80.2; 411/79; 211/41; 403/409.1
See application file for complete search history.

(56) References Cited

U.S. PATENT DOCUMENTS

| | | | | |
|---|---|---|---|---|
| 3,767,058 A | * | 10/1973 | Barlow et al. | 211/41.17 |
| 3,971,186 A | * | 7/1976 | Havelka et al. | 403/374.4 |
| 3,975,805 A | * | 8/1976 | Spurling et al. | 403/374.3 |
| 4,318,157 A | * | 3/1982 | Rank et al. | 361/704 |
| 4,354,770 A | * | 10/1982 | Block | 403/409.1 |
| 4,480,287 A | * | 10/1984 | Jensen | 361/707 |
| 4,775,260 A | * | 10/1988 | Kecmer | 403/409.1 |
| 4,819,713 A | * | 4/1989 | Weisman | 165/80.2 |
| 4,824,303 A | * | 4/1989 | Dinger | 411/79 |
| 4,879,634 A | * | 11/1989 | Storrow et al. | 361/708 |
| 4,909,752 A | * | 3/1990 | Hallum et al. | 439/325 |

(Continued)

*Primary Examiner*—Anatoly Vortman
(74) *Attorney, Agent, or Firm*—Robert K. Tendler; Daniel J. Long

(57) ABSTRACT

A two-part, high-density card retention system includes a tapered channel in a chassis or housing and a mating wedge that runs the length of the housing, with the lead wedge being cammed towards a flat channel surface by drawing the wedge inwardly and locating the edge of the board to be mounted between the wedge and the opposing straight channel wall. The mounting provides continuous high-pressure contact between the board and the straight channel wall for maximal thermal transfer and robust anti-vibration and anti-shock mounting of the board to the chassis. Because no additional assemblies are mounted to the edge of the board, the boards may be spaced apart by a fine pitch, thus to minimize the size of the module into which the boards are mounted.

13 Claims, 4 Drawing Sheets

U.S. PATENT DOCUMENTS

| | | | |
|---|---|---|---|
| 4,994,937 A * | 2/1991 | Morrison | 361/715 |
| 5,010,444 A * | 4/1991 | Storrow et al. | 361/719 |
| 5,036,428 A * | 7/1991 | Brownhill et al. | 361/721 |
| 5,071,013 A * | 12/1991 | Peterson | 211/26 |
| 5,090,840 A * | 2/1992 | Cosenza | 403/409.1 |
| 5,156,647 A * | 10/1992 | Ries | 411/75 |
| 5,225,964 A * | 7/1993 | Nemes | 361/719 |
| 5,253,963 A * | 10/1993 | Ries | 411/75 |
| 5,290,122 A * | 3/1994 | Hulme | 403/374.4 |
| 5,414,592 A * | 5/1995 | Stout et al. | 361/704 |
| 5,472,353 A * | 12/1995 | Hristake et al. | 439/327 |
| 5,607,273 A * | 3/1997 | Kecmer et al. | 411/79 |
| 5,779,388 A * | 7/1998 | Yamamoto | 403/374.1 |
| 5,827,585 A * | 10/1998 | Giannetti | 428/362 |
| 5,954,122 A * | 9/1999 | Sittig | 165/80.2 |
| 6,246,582 B1 * | 6/2001 | Habing et al. | 361/704 |
| 6,249,936 B1 * | 6/2001 | Webster | 24/569 |
| 6,285,564 B1 * | 9/2001 | O'Brien | 361/801 |
| 6,839,235 B2 * | 1/2005 | St. Louis et al. | 361/700 |
| 6,873,528 B2 * | 3/2005 | Hulan et al. | 361/719 |
| 7,031,167 B1 * | 4/2006 | Zagoory et al. | 361/759 |
| 2003/0223197 A1 * | 12/2003 | Hulan et al. | 361/719 |
| 2004/0037045 A1 * | 2/2004 | Phillips et al. | 361/719 |

* cited by examiner

HIGH DENSITY CARD RETENTION DEVICE

RELATED APPLICATIONS

This application claims rights under 35 USC § 119(e) from U.S. Application Ser. No. 60/682,756 filed May 19, 2005, the contents of which are incorporated herein by reference.

STATEMENT OF GOVERNMENT INTEREST

This invention was made with United States Government support under Contract No. 03-C-8308. The United States Government has certain rights in this invention.

FIELD OF THE INVENTION

This invention relates to printed circuit card retention and more particularly to securing a printed circuit card to a chassis to assure maximum thermal transmission to the chassis and for robust high-density card retention.

BACKGROUND OF THE INVENTION

Printed circuit cards have been mounted to a chassis or heat sink with devices that are mounted to the printed circuit card and which, when actuated, retain the edge of the circuit card in a slot in a chassis, housing or other circuit card-retaining frame. The printed circuit cards have also been mounted to a frame or chassis utilizing edge connectors. Edge connectors, while protecting electrical contact, do not in general provide vibration or shock resistance, nor do they support thermal transfer to a heat sink.

Note that it is important not only to be able to connect the circuit board to other circuit boards or to wiring, it is also important to be able to secure the circuit board against vibration and more importantly to be able to dissipate the heat generated by components on the board so that as the circuit board components are operated, the heat is dissipated to prevent failure.

Nowhere is this more important than circuit card-carrying field programmable gate arrays (FPGAs), which are utilized in a wide variety of processing applications. One type of application includes a so-called jam cube, which is utilized to house a receiver and a transmitter driver. In this application, the jammer receives incoming signals and transmits appropriate jamming signals.

As electronics are available in smaller and smaller sizes that perform more and more functions, there is a tradeoff between power and size. As one decreases the size of the device, one still needs to dissipate the same amount of power when performing the functions that the device is supposed to perform. Additionally, decreasing size may result in increased power consumption that drives the operating temperature of the electronics up.

For instance, for typical commercially available FPGAs, their operating range is between 85 and 100° C. It will be appreciated that in some applications the FPGA modules may dissipate between 5 and 20 watts, with this power required to be dissipated into the environment. Oftentimes ambient air at the board is not enough to dissipate the heat generated by the components on the board. As can be readily seen, there is a correspondence between the amount of signal processing that is performed and required heat dissipation, with heat buildup being a significant failure mode for these circuits.

Moreover, the shrinking of electronic modules requires that the circuit boards be placed on tighter pitches such that there is a requirement to mount boards side by side on 3/10-inch pitches.

One previous method for mounting circuit cards involves a so-called wedge lock, which is attached to the edge of the circuit card. Such wedge locks are made in one embodiment by Calmark, which involves six moveable segments that are configured as trapezoids such that then the bar containing these segments is tightened, the wedges move outwardly and contact a wall of a slot in a heat sink, chassis or frame.

The problems with such wedge lock assemblies are twofold, first having to do with the heat transfer efficiency and secondly, the size of the wedge lock assemblies that are mounted to the edges of the circuit cards.

It will of course be appreciated that each of the circuit cards must be provided with bars mounted to either end of the circuit card. For board re-spinning or replacement, if one wishes to switch out a circuit card, for instance, that is defective, one needs to mount these wedge lock assemblies to the ends of the new circuit card.

More important are the thermal barriers that are presented by these multi-part wedge lock structures. In their attempt to pull the heat out of the card and transfer it to the chassis, only a portion of the circuit card edge is thermally coupled to the heat sink by the wedge lock assembly.

It will be appreciated that the amount of heat that can be transferred from the card to the chassis is dependent upon the contact area between the card and the chassis. It also depends on the amount of pressure that can be exerted between the card and the chassis, with the higher the pressure the lower the resistance to heat flow.

Because in the multi-section wedge lock assembly wedges are spaced apart, typically only 50% of the available edge of a circuit card is thermally coupled to the chassis, heat sink or frame. Also, the contact pressure varies along the clamped edge of the card. Where there is contact, the pressure is high. Where there is no contact, the pressure is zero. Because of the way in which these wedge lock devices operate, there is thus increased the thermal resistance, which in essence fails to dissipate enough heat. It will be appreciated that one can directly relate contact area to the temperature of the components on the printed circuit. Since the thermal and physical contact area does not encompass the entire edge of the card, heat transfer and mechanical locking properties are not as robust as they could be.

In summary, the wedge lock type of card mounting assemblies present a barrier to heat transfer, since the temperature flow across each of the spaced-apart trapezoidal surfaces is only some percentage of the total area available.

Secondly and as mentioned above, mechanical retention of the card in the chassis is vitally important to minimize shock or vibration dislodgment of printed circuit boards. It is of paramount importance to provide a maximal amount of pressure to clamp the circuit board to the chassis, with any additional pressure also increasing the thermal transfer.

As before with the wedge lock assemblies, pressure is discontinuous along the edge of the card, with some areas under high pressure, while other areas under zero pressure. This discontinuity is believed to be more susceptible to circuit card damage under vibration at the interface of the high pressure/zero pressure zones than a continuously clamped circuit card would experience.

There are standard circuit board retainers such as manufactured by ZIF. These retainers have an elliptical cross-section cam that presses against a thin, flat spring that contacts the circuit board. However, this multi-part device offers a high-resistance heat transfer path due to the fact that heat has to go through a thin contacting blade, a cam and a thin wall.

In summary, there is a requirement to be able to mount and retain printed circuit cards in a chassis, heat sink or frame, first and foremost to maximize the thermal transfer between the card and the chassis. Secondly, there needs to be a mechanism for providing that the entire length of the edge of the card be clamped to the chassis, both for maximal heat transfer and for continuous pressure robust mounting. Thirdly, there is a requirement that the pitch of these boards be reduced so that multiple boards can be mounted in reduced-size modules. Lastly, prior art devices expand and move away from the circuit card as they are tightened. It would be preferable to produce a clamping device that moves towards the card, making tighter card spacing possible.

Additionally, there is a requirement to able to clamp the board to the chassis with easy access to tightening screws and, most importantly, to provide a universal mounting system that can accommodate any configuration of circuit board without having cumbersome assemblies attached to board edges. This latter requirement permits easy removal and substitution of boards in the chassis without first having to provide a specialized assembly at the end of the circuit board.

SUMMARY OF INVENTION

A high-density card retention system that addresses all of the aforementioned problems includes two parts. The first is a tapered channel or slot in the chassis and the second is a mating wedge that runs the length of the channel. The taper and wedge are such that when the wedge is drawn towards the channel it moves towards an opposing channel wall to sandwich and clamp the entire card edge to the opposing wall. This provides clamping pressure along the entire edge of the card to promote efficient heat transfer to the chassis as well as providing robust mechanical mounting.

In one embodiment, a machined surface in the chassis itself provides for the tapered channel that has one straight wall and one angled wall. The subject retention device thus includes a tapered channel into a wall of a chassis and a wedge-shaped part resembling the volume removed during machining. Bolts or screws are used to move the wedge-shaped part towards the straight wall to wedge a board edge into engagement with the chassis along the entire length of the board edge.

In one embodiment, slots are cut through the chassis to accommodate lateral movement of the bolts or screws as they tighten the wedge against the board, with the wedge-shaped part being provided with tapped holes aligned with the slots and through which the bolts or screws protrude.

In operation, a card is inserted between the wedge and the straight wall of the slot in the chassis. The bolts or screws are then tightened from outside of the chassis. As the bolts are tightened, the wedge is drawn towards the card to clamp the card between the wedge-shaped part and the opposing straight wall of the chassis slot.

Thus, instead of machining a square channel in a chassis designed to be utilized with the multi-piece wedge-lock assembly, a universal high-density card retention system is provided in which the circuit card itself is not first provided with an edge assembly, but rather is merely inserted between the wedge-shaped part and the opposing straight wall of the chassis.

Thus, while traditional card-clamping techniques involved a multi-piece device whose parts slide relative to one another and that provide only partial contact between the board and the chassis, the subject system provides continuous contact of the edge of the board with the chassis to provide for maximal thermal transfer. Moreover, the pitch for the boards can be minimized because the boards need not be provided with the aforementioned external edge assemblies, and because the clamping mechanism moves towards the board as it is tightened, not away. Additionally, the clamping pressure being along the entire edge of the card contributes to thermal transfer as well as mechanical vibration and shock resistance.

Thus, the disadvantage of the relatively thick multi-piece wedge locks and their inability to support fine-pitch mounting, along with non-optimal compression force is avoided because of the large size of the wedge locks. Chassis walls have been limited to bent sheet metal to attempt to actuate the fine pitch. However, the bent sheet metal does not offer high compression forces or large heat transfer area due to the thin cross-section. This in turn results in high thermal resistance. In the subject invention, relatively thick chassis walls can be provided and still retain a fine pitch. Moreover, the subject two-part system provides a universal retention system that does not require edge assemblies to be first attached to the printed circuit cards. In the subject system, the wedge straight wall line contact with the entire edge of the card provides maximal thermal transfer and maximal mechanical stability while at the same time providing for high-density card retention.

In summary, a two-part, high-density card retention system includes a tapered channel in a chassis or housing and a mating wedge that runs the length of the housing, with the lead wedge being cammed towards a flat channel surface by drawing the wedge inwardly and locating the edge of the board to be mounted between the wedge and the opposing straight channel wall. The mounting provides continuous high-pressure contact between the board and the straight channel wall for maximal thermal transfer and robust anti-vibration and anti-shock mounting of the board to the chassis. Because no additional assemblies are mounted to the edge of the board, the boards may be spaced apart by a fine pitch, thus to minimize the size of the module into which the boards are mounted.

BRIEF DESCRIPTION OF THE DRAWINGS

These and other features of the subject invention will be better understood in connection with the Detailed Description, in conjunction with the Drawings, of which.

DETAILED DESCRIPTION

Figure 1:
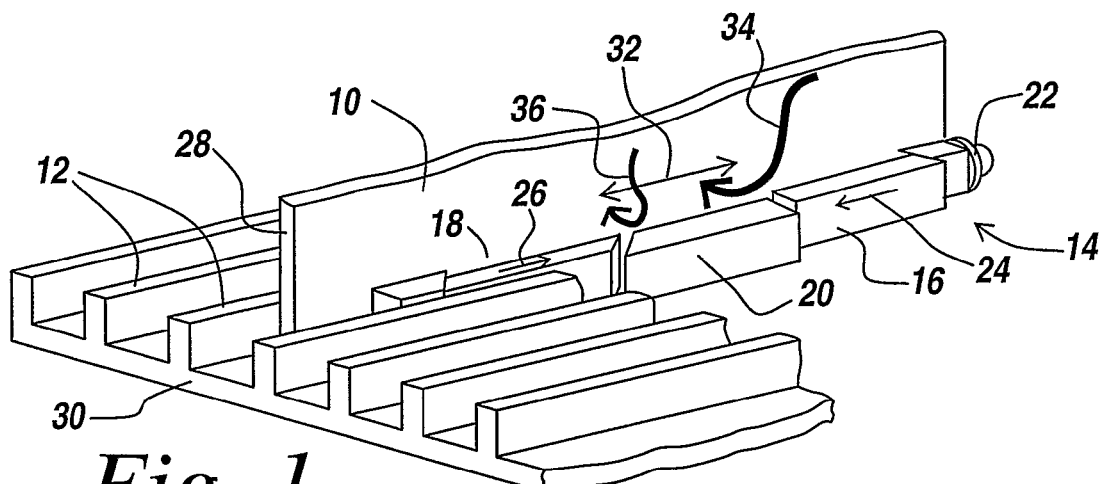
FIG. 1 is a diagrammatic illustration of a prior art wedge lock printed circuit board or card mounting assembly, illustrating areas on the board that are not contacted by the assembly, thus presenting a barrier to heat flow, with an additional heat flow barrier occurring at the abutting parts of the multi-part wedge lock assembly.

Referring now to FIG. 1, in the prior art a circuit board 10 is to be clamped to opposed upstanding ridges 12 through the use of a wedge lock assembly 14, which is a multiple-section device including stationary sections 16 and 18 mounted to the board, and a wedge 20, which is moved away from the board when a lead screw 22 is tightened to move sections 16 and 18 in the direction of arrows 24 and 26 respectively. Since the backside of board 10, here illustrated at 28, abuts a rib 12, the movable wedge 20 is moved by the aforementioned lead screw actuation to abut an opposed rib, with the ribs serving to define rectilinear channels in a chassis 30.

It will be appreciated that with lead screw actuation, wedge 20 moves away from the face of board 10 and contacts the opposing rib. This movement away from the card provides an area of no contact 32 such that heat flow from the board through the wedge lock assembly to the rib and thus the chassis is impeded as illustrated by arrow 34 at the area of no contact.

Thus there is a portion of the wedge lock assembly that, when actuated, does not contact board 10.

Likewise, there is an impediment to heat flow across the abutted parts, as illustrated by arrow 36, which limits the travel of heat across the abutment, for instance, from section 18 through wedge 20 to the associated rib.

Figure 2:
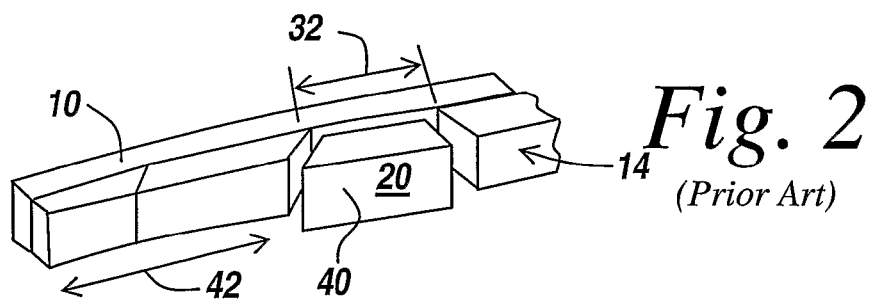
FIG. 2 is a diagrammatic illustration of a portion of the assembly of FIG. 1, illustrating that not only is there a lack of contact of a portion of the wedge lock assembly with respect to the board, there is also an area of no contact with the rib against which the board is to be wedged.

Referring to FIG. 2, it can be seen that wedge 20 has a limited area 40 contacting the opposed rib, whereas the area of non-contact with the card is as illustrated at 32. Likewise, as can be seen in this figure, there is a no-contact area with the rib, as illustrated by arrow 42.

Figure 3:
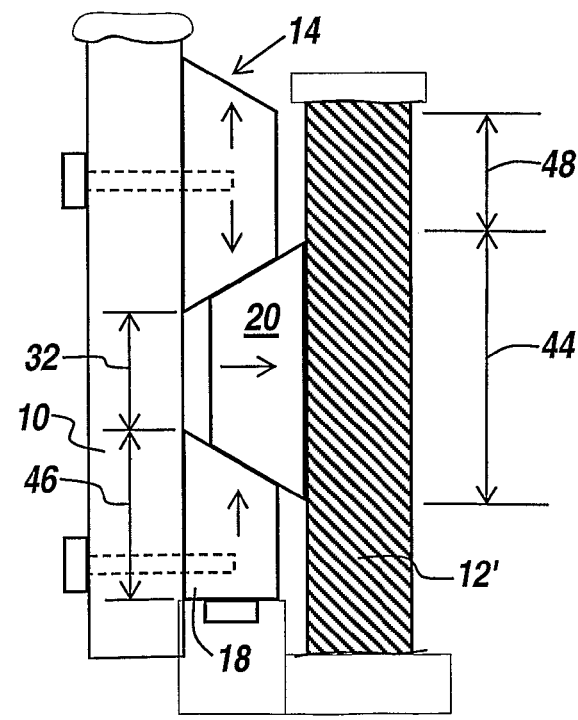
FIG. 3 is a cross-sectional view of the wedge lock assembly of FIGS. 1 and 2, illustrating areas of no contact of the wedge lock assembly with the board and areas of no contact of the assembly with respect to the opposing rib, illustrating the limited area contact of the wedge lock assembly with both the board and the opposing rib.

More particularly and referring to FIG. 3, it can be seen that there is a limited area of contact with the rib, illustrated by arrow 44, in terms of the contact of wedge 20 with rib 12.' Likewise, what is readily seen is the area of no contact 32 between the wedge and board 10.

What will also be seen is that there is a limited area of contact with the board by, for instance, wedge lock section 18, as illustrated by arrow 46, whereas there is an area indicated by arrow 48 where there is no contact with rib 12' by wedge lock assembly 14.

Figure 4:
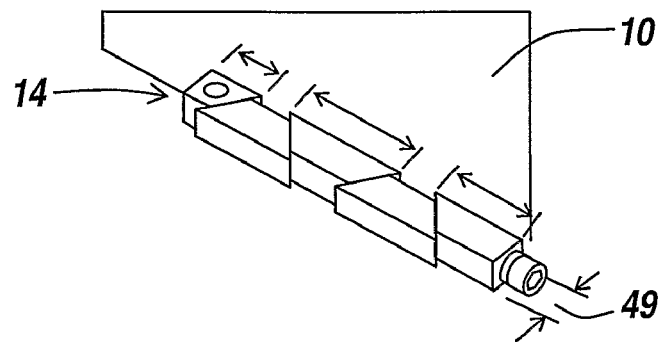
FIG. 4 is a diagrammatic illustration of a wedge lock assembly mounted to a circuit board or card, indicating contact area on the order of 50%, also illustrating the thickness that is added to the thickness of the board with the mounting of the wedge lock assembly to the board or card.

In summary and referring to FIG. 4, it will be seen that in one instance, wedge lock assembly 14 has only a 50% contact area along the edge of board 10.

As important, there is an additional thickness 49 added to the thickness of board 10 due to the necessity of mounting the wedge lock assembly to the card. It will be appreciated that the thickness of the wedge lock assembly is much larger than the thickness of the board, such that the pitch to which the cards can be mounted is severely limited by the size of the additional assembly added to the edge of the board to mount the card to a chassis.

Figure 5:
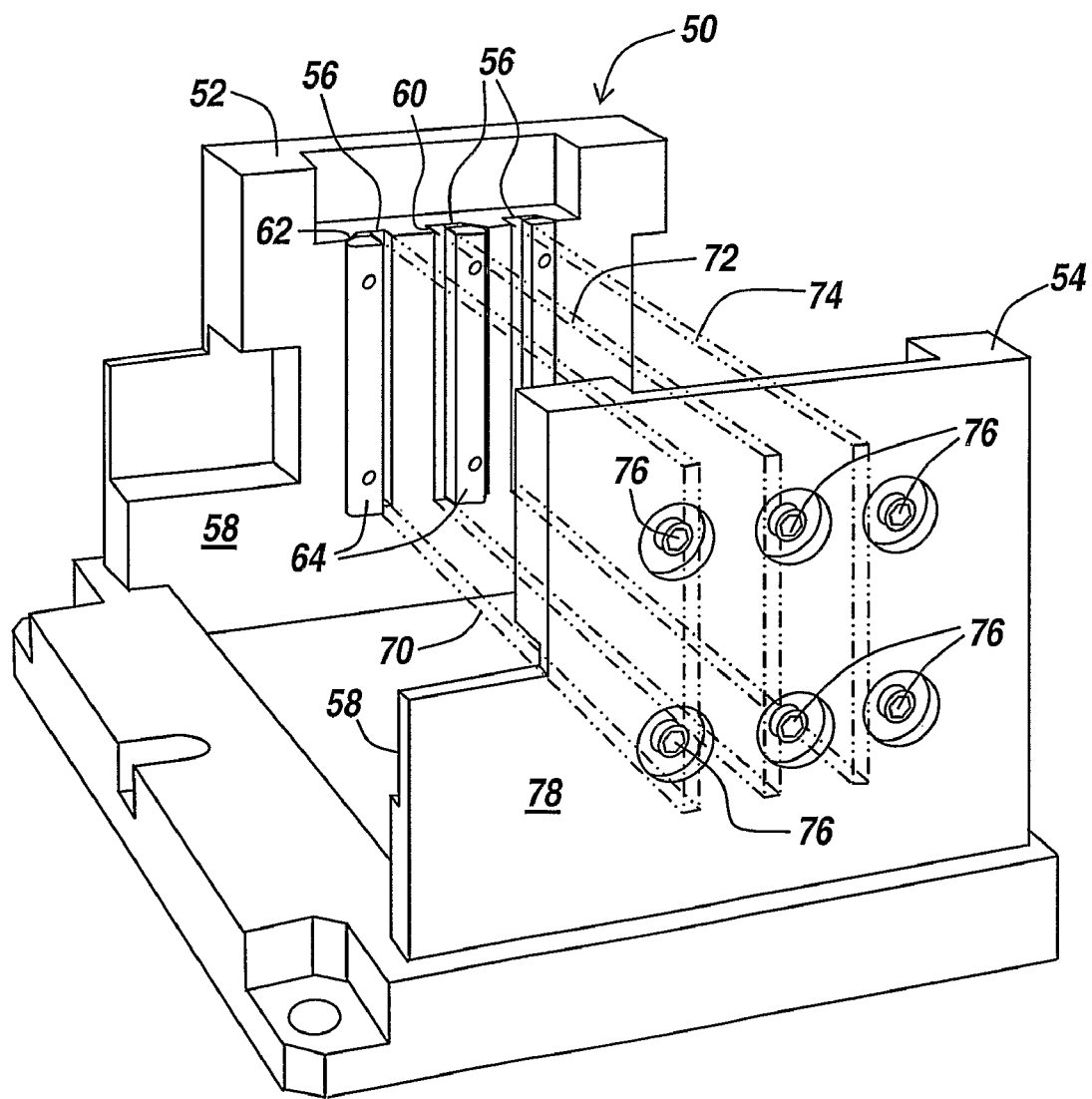
FIG. 5 is a diagrammatic illustration of the utilization of the subject two-part card retention system, illustrating the positioning of a wedge in a corresponding slot in a chassis, with a board inserted between the wedge and a straight chassis slot wall so as to provide continuous contact along the edge of the board for maximal heat transfer between the board and the chassis.

Referring now to FIG. 5 and rather than using any kind of an assembly mounted to a board or card, in FIG. 5 a chassis 50 is provided with opposed upstanding walls 52 and 54, each of which has elongated chamfered or tapered slots 56 in opposing faces 58 of the walls.

Each of these slots is configured with a straight wall face 60 and a chamfered or tapered wall face 62, with a like-configured wedge 64 screwed into the associated slot 56.

As can be seen, boards or cards 70, 72 and 74 are inserted into the associated slots prior to the cam action of the wedge to move to the right to wedge the board edge to the associated straight slot wall.

As will be seen, the slot is co-extensive with and continuous along the edge of the board or card such that when the wedge is cammed into contact with the board to press it into the opposed straight slot wall, there is continuous thermal and physical contact as well as contact between the board and the straight wall of the slot in the chassis.

What this means is that there is very little in the way of a thermal barrier between the entire board or card edge and the chassis such that there is maximal thermal transfer away from the card to the chassis, which in most cases serves as a heat sink.

It will also be noted that screws or bolts 76 are exposed on a external chassis wall face 78, in this case of wall 54, such that the wedges can be cammed by accessing the exposed screws from this exterior face.

Since the slot in the chassis walls can be spaced on 300 mm centers, corresponding to ⅒ of an inch, a number of cards can be mounted to the chassis on a relatively fine pitch governed only by the height of the components on the boards or cards themselves. Since the cards themselves do not carry any wedge lock assembly that increases the overall thickness of the card, the use of an assembly-less card retention system promotes high-density card mounting.

Figure 6:
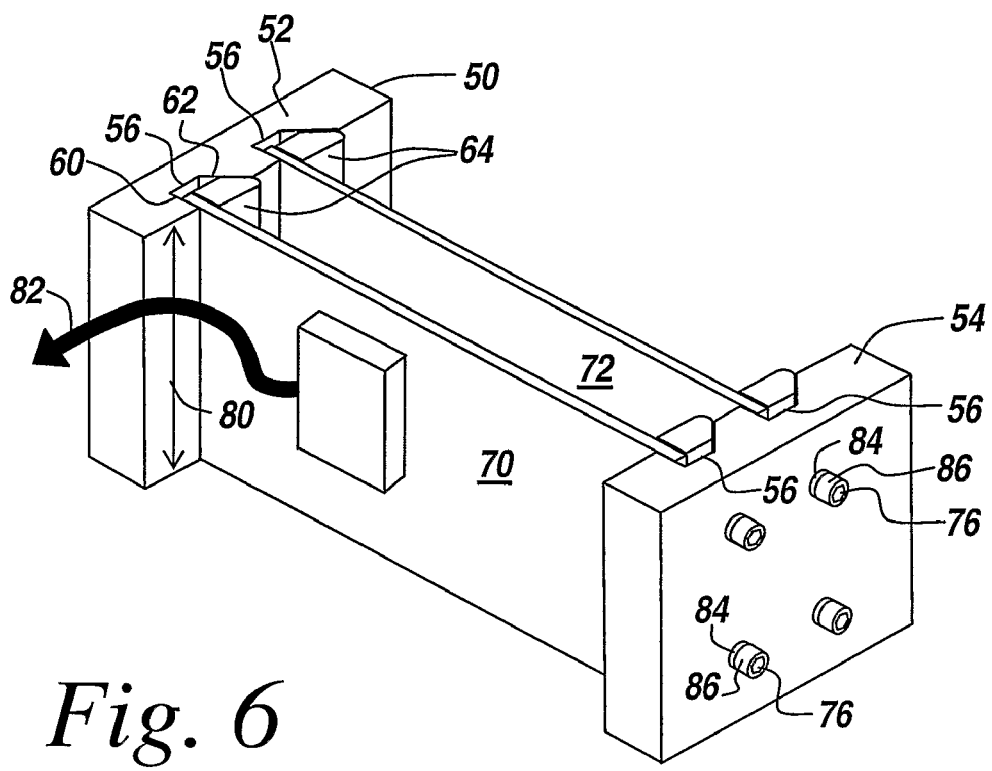
FIG. 6 is a diagrammatic illustration of the board retention system of FIG. 5, illustrating a chamfered chassis slot configuration within which the chamfer or camming surface of the slot is to one side of the slot and a straight slot wall located to the other side of the slot, with a board being wedged between the straight slot wall and the wedge to provide unimpeded heat flow from components on the board through the board to the chassis.

More particularly and referring now to FIG. 6, it can be seen that walls 52 and 54 are provided with slots 56 having a straight slot wall 60 and a chamfered or tapered wall 62.

It can be seen that boards or cards 70 and 72 are inserted between the corresponding wedge 70 and the straight slot wall 60. This provides a continuous edge contact area 80 as indicated by the double-ended arrow.

It is noted that the boards themselves are not provided with any clamping assemblies and may be used in their now-populated state. Moreover, there is a continuous edge through which there is an unimpeded heat flow, as illustrated by arrow 82. Not only is there an unimpeded heat flow across the entire edge of the circuit card, there is an increased opportunity to provide maximal clamping pressure due to the large contact area, which is co-extensive to the lineal dimension of the inserted board or card.

As can be seen, screws or bolts 76 are available at exposed surface 78 for drawing in the wedges 64 with helical split lock washers or Belleville washers 84 inserted between the bolthead 86 and face 78 of wall 54.

Figure 7:
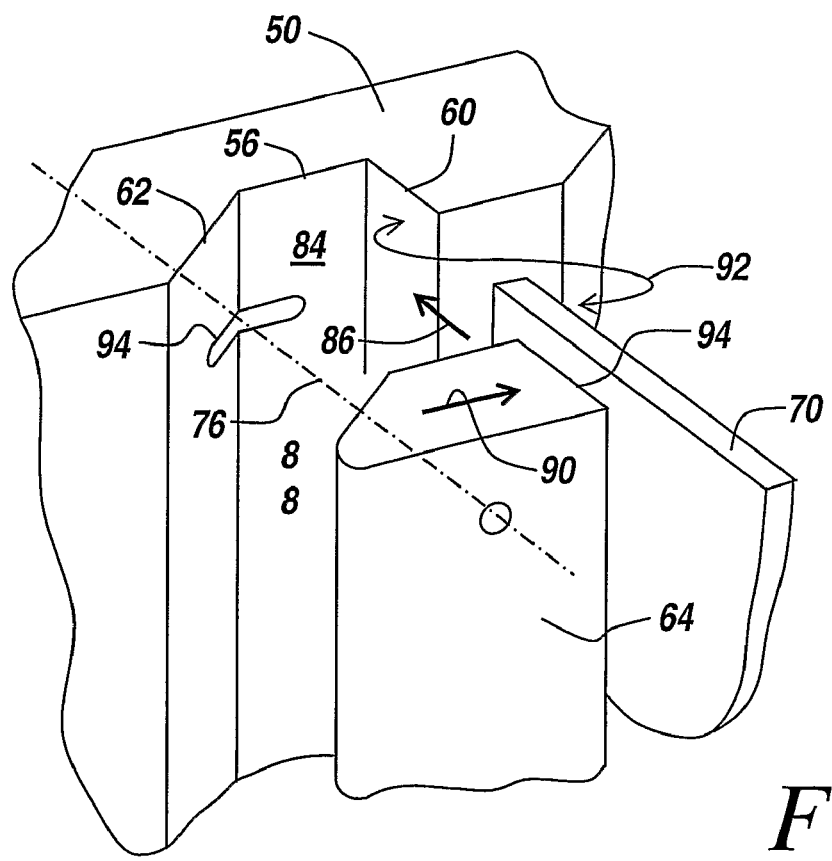
FIG. 7 is a diagrammatic illustration of the camming action of the wedge against the chamfered slot wall when the wedge is drawn towards the bottom of the slot through screw actuation, such that a flat face of the wedge is pressed against the adjacent surface of a board inserted between the wedge and the straight slot wall.

Referring now to FIG. 7, the slotted chassis structure can be more clearly seen in which slot 56 is shown having a straight wall face 60 and an angled wall face 62. Here, wedge 64 is drawn towards bottom 84 of slot 56 through the action of screws 76 that serve to move wedge 70 in the direction of arrow 86. In so doing, the wedge, when it is cammed against wall 62, moves as illustrated at 90 towards board 70, which is inserted as illustrated by arrow 92 into the region between flat face 94 of wedge 64 and straight slot wall face 60 in chassis 50.

Figure 8:
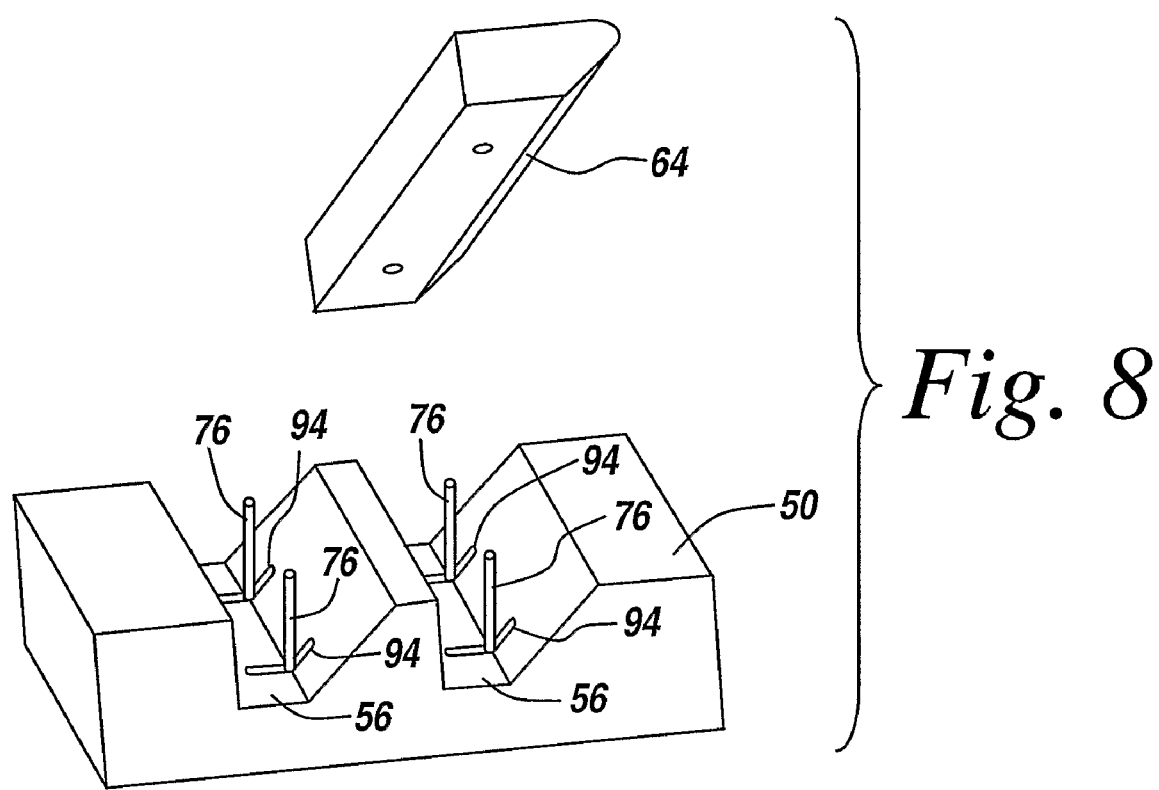
FIG. 8 is a diagrammatic illustration of a portion of the chamfered slot assembly, illustrating elongated screw-guiding slots such that as the screws are tightened into the corresponding wedge, the screws are allowed to move laterally as the wedge is cammed from right to left; and, FIG. 9 is a schematic diagram of the forces involved in the camming action of the subject invention to illustrate maximal clamping force along the entire edge of the board, both to provide an anti-vibration/shock mounting and to effectuate maximal heat transfer from the board to the chassis due to the pressure that is available through the camming actuation of the wedge along the entire edge of the board.

Referring now to FIG. 8, in order for screws 76 to effect a smooth camming of wedge 64, a number of slots 94 are machined into housing 50 within slots 56 so that as the wedge cams on the camming surface, the screws move with it so they do not cant.

As the wedges are tightened, the wedge surface is drawn toward the card. The relationship between retainer preload, retention torque, and clamping force is derived below. The variables are defined in FIG. 9.

Figure 9:
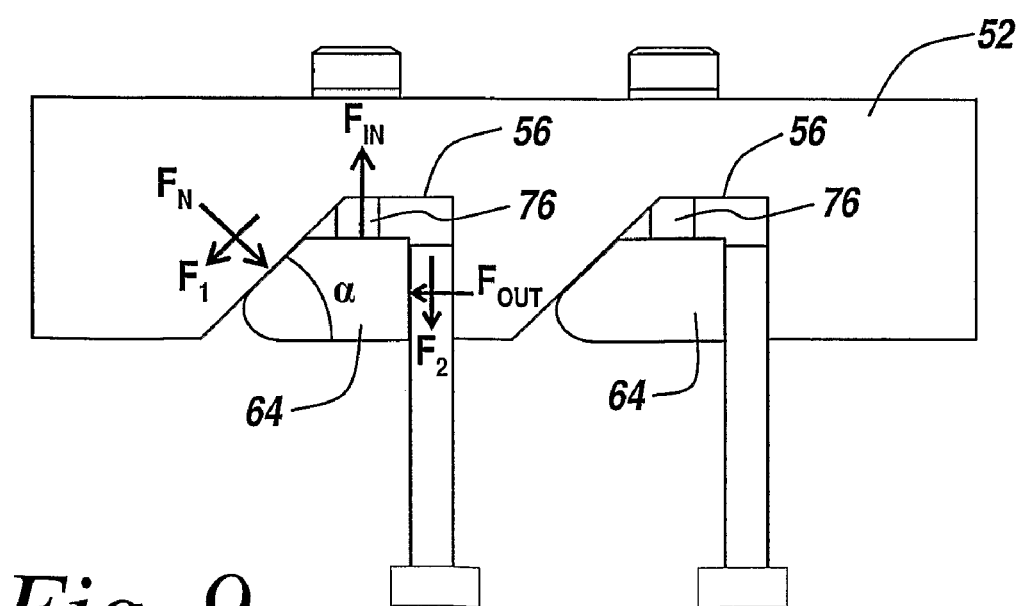

Referring now to FIG. 9, what is shown is a diagrammatic illustration of the forces involved with respect to the camming action of wedge 64 in channels 56 of chassis wall 52.

Force Balance $$\Sigma F_x = -F_{IN} + F_2 + F_N \cos\alpha + F_1 \sin\alpha = 0$$

$$\Sigma F_y = -F_{OUT} + F_N - F_1 \cos\alpha = 0$$

$$F_1 = F_N \mu_1$$

$$F_2 = F_{OUT} \mu_2$$

System of Equations $$F_{IN} = F_{OUT}\mu_2 + F_N \cos\alpha + F_N\mu_1 \sin\alpha = F_{OUT}\mu_2 + F_N(\cos\alpha + \mu_1 \sin\alpha)$$

$$F_{OUT} = F_N \sin\alpha - F_N \mu_1 \cos\alpha = F_N(\sin\alpha - \mu_1 \cos\alpha)$$

$$F_N = \frac{F_{OUT}}{\sin\alpha - \mu_1 \cos\alpha}$$

$$F_{IN} = F_{OUT}\mu_2 + \frac{F_{OUT}}{\sin\alpha - \mu_1 \cos\alpha}(\cos\alpha + \mu_1 \sin\alpha)$$

$$F_{IN} = F_{OUT}\left(\mu_2 + \frac{\cos\alpha + \mu_1 \sin\alpha}{\sin\alpha - \mu_1 \cos\alpha}\right)$$

$$= F_{OUT}\left(\mu_2 + \frac{1 + \mu_1 \tan\alpha}{\tan\alpha - \mu_1}\right)$$

$$= F_{OUT} K_G$$

FROM REFERENCE: J. E. Shigley and C. R. Mischke; Mechanical Engineering Design, Fifth Edition; McGraw-Hill Inc; 1989.

$$F_{IN} = \frac{T}{K_T d} = F_{OUT} K_G$$

Relationship $$F_{OUT} = \frac{T}{K_T K_G d},$$

where $$K_G = \mu_2 + \frac{1 + \mu_1 \tan\alpha}{\tan\alpha - \mu_1},$$

T=torque, $F_{OUT}$ is the clamping force.

The formula for $K_T$ is derived in the reference, but depends on a friction coefficient between the wedge material and the screw material. The reference states that $K_T \approx 0.20$ for a friction coefficient of 0.15 no matter what size bolts are employed and no matter whether the threads are coarse or fine.

While the present invention has been described in connection with the preferred embodiments of the various figures, it is to be understood that other similar embodiments may be used or modifications or additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. Apparatus for mounting printed circuit cards to a chassis to assure maximum thermal transmission from the card to the chassis and for robust high-density card retention in the chassis to mitigate shock and vibration damage, comprising:

a chassis having opposed upstanding walls, each of said walls including at least one slot having a straight-walled face and an opposed chamfered face;

a wedge having a matching exterior surface such that a chamfered surface on said wedge is adapted to cam against the chamfered surface of said slot, said wedge having an opposed flat surface; and, a screw actuator for drawing said wedge into said slot such that said wedge is cammed towards said straight-walled face, whereby when a printed circuit card edge is inserted between said wedge and said straight-walled face, and said wedge is moved towards said straight-walled face, robust edge contact with said printed circuit card is established to promote thermal transfer from said edge to said chassis at said straight-walled face, said slot including transverse apertures at the bottom thereof running perpendicular to said slot, said screw actuators extending through selected apertures such that upon tightening of said screw actuators, as said wedge moves towards said straight-walled face, said screw actuators move in said transverse apertures towards said straight-walled face with the cammed movement of said wedge.

2. The apparatus of claim 1, wherein the length of said slot and the length of said wedge are co-extensive with the length of said edge, whereby there is continuous physical and thermal contact between said edge and said straight-walled face to promote said thermal transfer.

3. The apparatus of claim 1, wherein said screw actuators include heads at the distal ends thereof, said heads being exposed through associated chassis walls to permit un obstructed wedge adjustment.

4. The apparatus of claim 3, and further including washers between the heads of said actuators and the associated chassis wall through which said heads are exposed.

5. The apparatus of claim 4, wherein said washer is taken from the group consisting of Belleville washers and helical split lock washers.

6. A method for effectuating thermal transfer between a printed circuit card and the chassis to which the printed circuit card is retained, comprising the steps of:

provyding the chassis with upstanding walls having slots therein to receive opposed edges of the printed circuit card;

locating a cam-actuated wedge in each of the slots, the length of the wedge and the length of the slots being of a length to provide continuous physical and thermal contact between an inserted card edge and the slot; and, actuating the wedge to clamp the edge of the card to an associated slot surface utilizing bolts passing through a transverse slot, whereby continuous physical and thermal contact is obtained between the wedge and the circuit card edge, and between the circuit card edge and the slot surface for maximal thermal transfer from the circuit card to the chassis.

7. The method of claim 6, wherein the slot has a chamfered surface and an opposed straight face, and wherein the wedge includes a matching chamfered surface and straight face, whereby the card edge is clamped between straight faces along the extent thereof.

8. The method of claim 7, wherein the card has a predetermined edge length and wherein the straight faces contact substantially all of the edge length, whereby there are no voids or interruptions in the contact area between the wedge, the slot and the card edge that would act as a barrier to heat flow.

9. The method of claim 6, wherein the card edge contains no edge clamping assemblies mounted thereon, and further including the step of locating the slots on a fine pitch due to the lack of edge-carried assemblies, thereby to promote high-density card retention in the chassis.

10. A method for high-density card retention in a chassis, comprising the steps of:

providing slot and wedge combinations in walls of the chassis to retain an edge of a printed circuit card therebetween; and, moving the wedge towards the slot utilizing bolts passing through a transverse slot with the edge of the circuit card between the wedge and a slot wall to effectuate thermal transfer between the card edge and the slot wall, whereby a large number of fine-pitch slots may be located in the chassis walls to accommodate high-density card retention due to the absence of card edge clamping assemblies.

11. The method of claim 10, wherein each of said slots includes a chamfered wall and an opposed flat straight slot wall, and wherein the wedge includes a like-chamfered surface and an opposed flat straight surface.

12. The method of claim 11, wherein the edge of the card inserted between the wedge and the flat straight slot wall has a predetermined length and wherein the wedge and the flat straight slot wall are of a length at least equal to the length of the inserted edge, thereby to effectuate continual physical and thermal contact along the inserted card edge.

13. The method of claim 10, and further including the step of drawing the wedge towards the slot bottom to cause the wedge to move towards the flat straight slot wall for applying continuous and even pressure across the inserted card edge, whereby the contact pressure across the inserted card edge is uniform and controlled by the movement of the wedge in the slot.

* * * * *